(12) United States Patent
Gupta et al.

(10) Patent No.: US 12,389,599 B2
(45) Date of Patent: Aug. 12, 2025

(54) INTEGRATED ASSEMBLIES AND METHODS OF FORMING INTEGRATED ASSEMBLIES

(71) Applicant: Micron Technology, Inc., Boise, ID (US)

(72) Inventors: Sidhartha Gupta, Boise, ID (US); Naveen Kaushik, Boise, ID (US); Pankaj Sharma, Boise, ID (US); Kyle A. Ritter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 276 days.

(21) Appl. No.: 17/158,259

(22) Filed: Jan. 26, 2021

(65) Prior Publication Data
US 2022/0238546 A1    Jul. 28, 2022

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............ *H10B 43/27* (2023.02); *H10B 41/10* (2023.02); *H10B 41/27* (2023.02); *H10B 43/10* (2023.02)

(58) Field of Classification Search
CPC ......... H01L 27/11556; H01L 27/11582; H01L 29/7926; H01L 27/11524; H01L 27/1157; H10B 43/47; H10B 41/27; H10B 41/10; H10B 43/10
See application file for complete search history.

(56) References Cited

U.S. PATENT DOCUMENTS

| | | | |
|---|---|---|---|
| 10,290,643 B1* | 5/2019 | Kai | H01L 29/7883 |
| 10,720,445 B1* | 7/2020 | Shimizu | H01L 23/5226 |
| 2013/0292549 A1* | 11/2013 | Fujita | H01L 27/14603 250/208.1 |
| 2015/0008505 A1* | 1/2015 | Chien | H10B 41/20 257/324 |
| 2016/0056169 A1* | 2/2016 | Lee | H10B 99/00 438/269 |
| 2017/0053986 A1* | 2/2017 | Liu | H10B 41/27 |
| 2018/0138189 A1* | 5/2018 | Kai | H01L 21/02494 |
| 2018/0308858 A1* | 10/2018 | Hopkins | H01L 29/1037 |
| 2019/0115362 A1* | 4/2019 | Choi | H10B 43/50 |
| 2021/0020653 A1* | 1/2021 | Zhu | H10B 41/27 |
| 2021/0217768 A1* | 7/2021 | Fukuzumi | H01L 21/76877 |
| 2022/0216231 A1* | 7/2022 | Lim | H01L 29/1054 |

* cited by examiner

*Primary Examiner* — William B Partridge
*Assistant Examiner* — David Paul Sedorook
(74) *Attorney, Agent, or Firm* — Wells St. John P.S.

(57) ABSTRACT

Some embodiments include an integrated assembly having a channel-material-pillar extending vertically through a stack of alternating conductive levels and insulative levels. The channel-material-pillar includes a first semiconductor material. A second semiconductor material is directly against an upper region of the channel-material-pillar. The second semiconductor material has a higher dopant concentration than the first semiconductor material and joins to the first semiconductor along an abrupt interfacial region such that there is little to no mixing of dopant from the second semiconductor material into the first semiconductor material. Some embodiments include methods of forming integrated assemblies.

56 Claims, 14 Drawing Sheets

INTEGRATED ASSEMBLIES AND METHODS OF FORMING INTEGRATED ASSEMBLIES

TECHNICAL FIELD

Methods of forming integrated assemblies (e.g., integrated memory devices). Integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select-device (e.g., source-side select gate, SGS) 210 and a drain-select device (e.g., drain-side select gate, SGD) 212. Each source-select-device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select-device 210 is connected to a common source line 216. The drain of each source-select-device 210 is connected to the source of the first charge-storage transistor 208 of the corresponding NAND string 206. For example, the drain of source-select-device $210_1$ is connected to the source of charge-storage transistor $208_1$ of the corresponding NAND string $206_1$. The source-select-devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The vertically-stacked memory cells of three-dimensional NAND architecture may be block-erased by generating hole carriers beneath them, and then utilizing an electric field to sweep the hole carriers upwardly along the memory cells. Gating structures of transistors may be utilized to provide gate-induced drain leakage (GIDL) which generates the holes utilized for block-erase of the memory cells. The transistors may be the source-side select (SGS) devices and/or the drain-side select (SGD) devices.

It is desired to develop improved methods of forming integrated memory (e.g., NAND memory). It is also desired to develop improved memory devices.

DETAILED DESCRIPTION OF THE ILLUSTRATED EMBODIMENTS

Some embodiments include integrated assembly having channel material (lightly-doped or undoped semiconductor material) directly adjacent to heavily-doped semiconductor material, and having a sharp dopant interface along a region where the two materials join to one another. Some embodiments include methods of forming integrated assemblies (e.g., memory devices). Example embodiments are described with reference to FIGS. 5-13.

Figure 1:
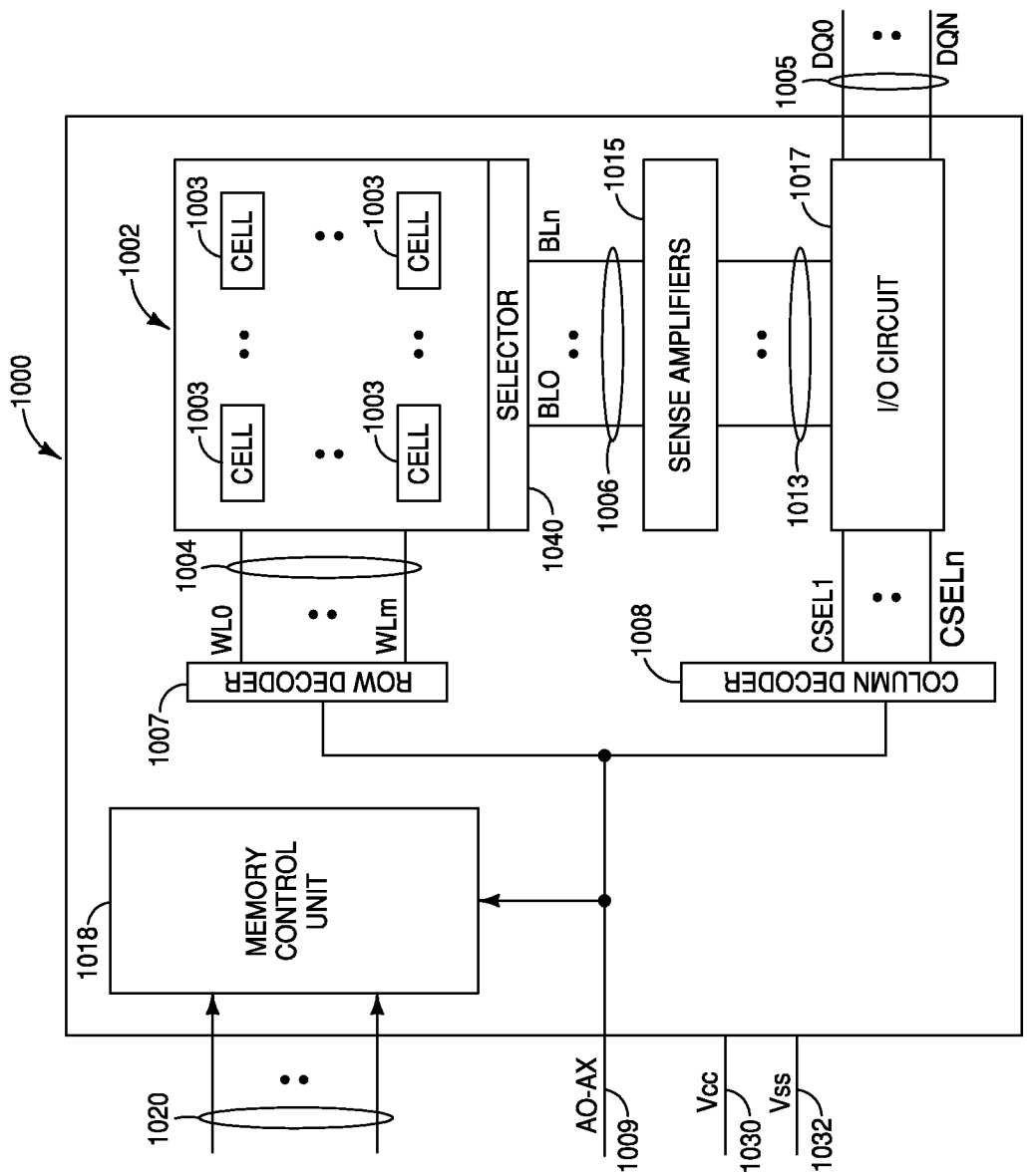
FIG. 1 shows a block diagram of a prior art memory device having a memory array with memory cells.
Figure 2:
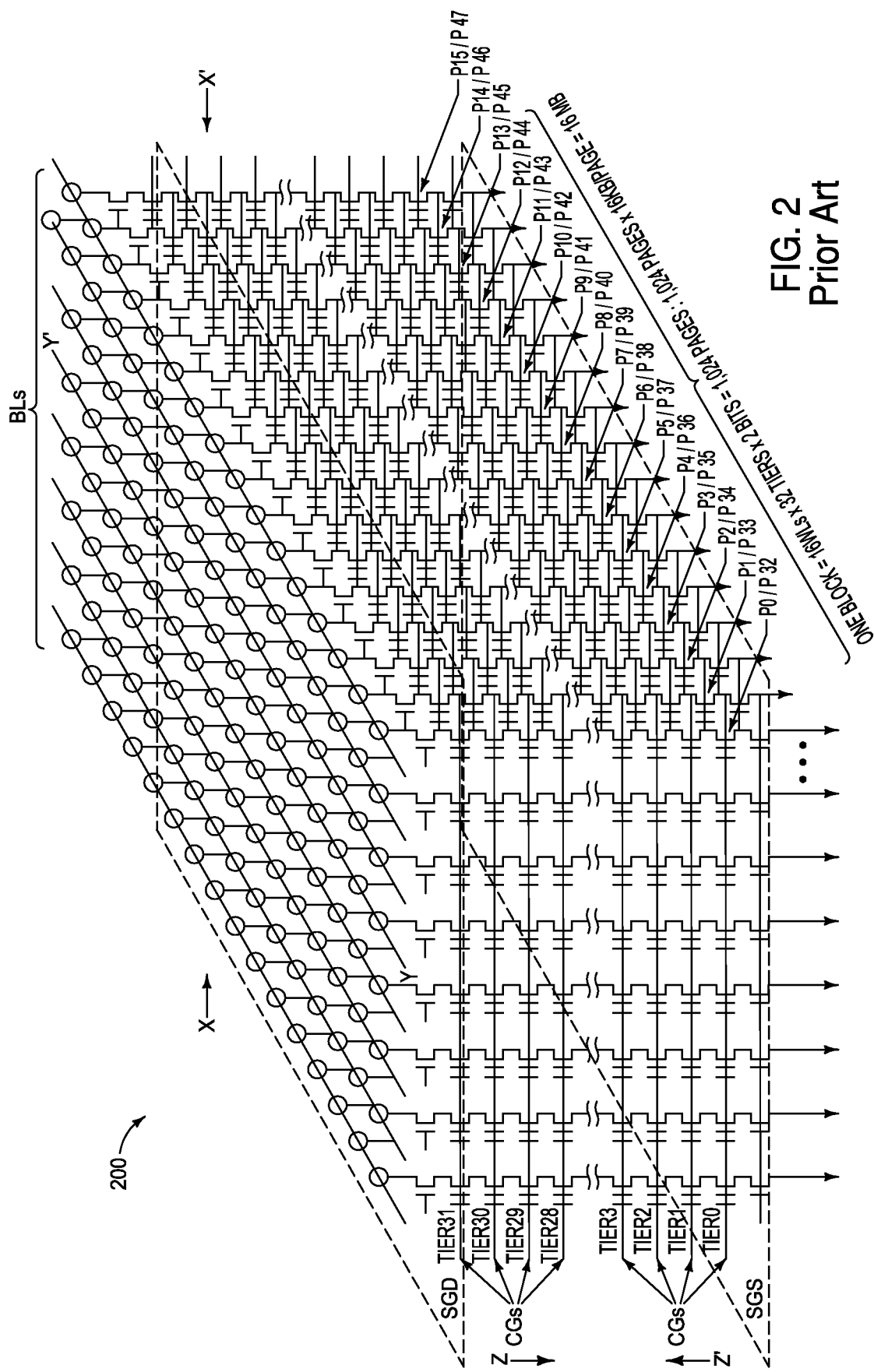
FIG. 2 shows a schematic diagram of the prior art memory device of FIG. 1 in the form of a 3D NAND memory device.
Figure 3:
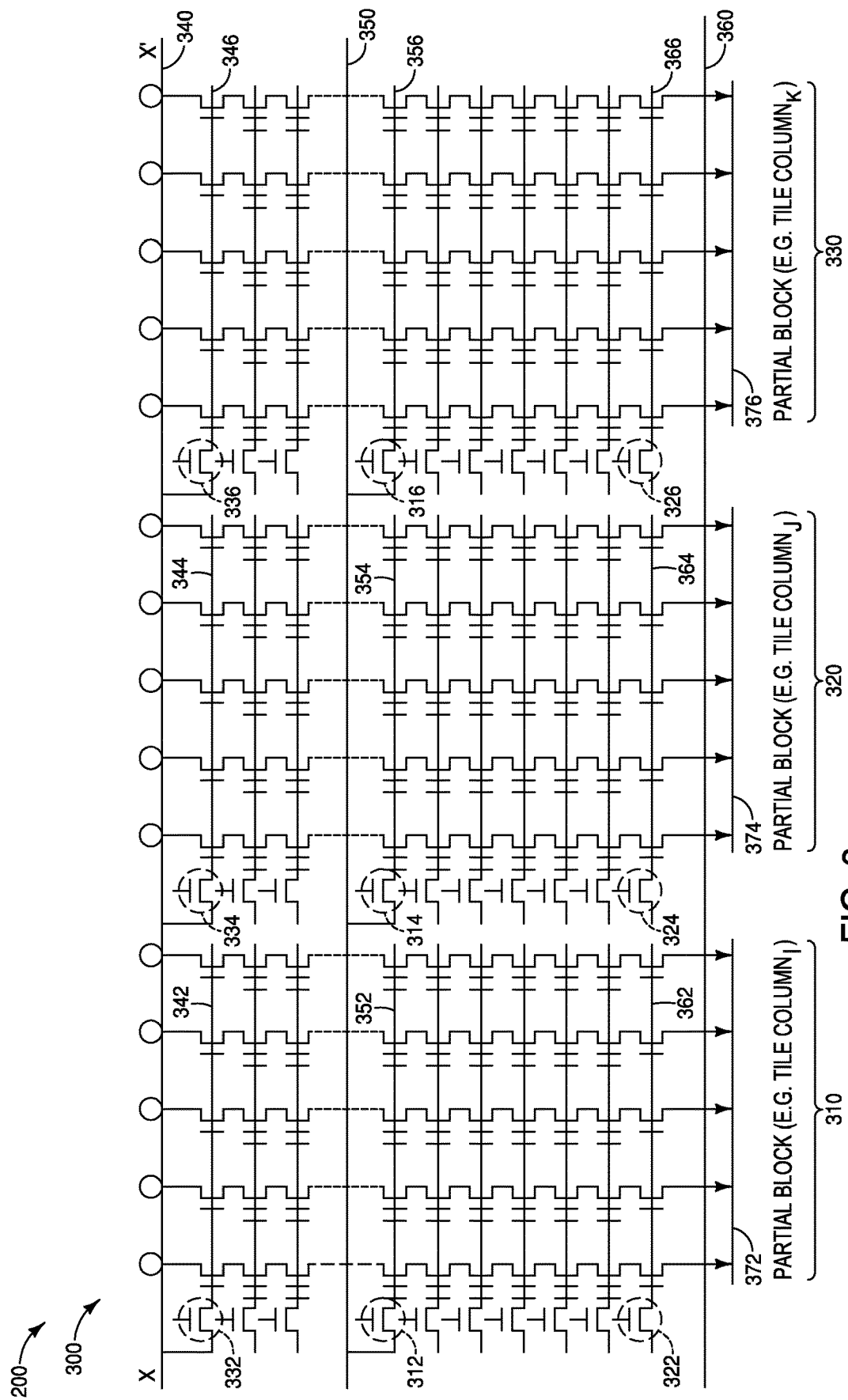
FIG. 3 shows a cross-sectional view of the prior art 3D NAND memory device of FIG. 2 in an X-X' direction.
Figure 4:
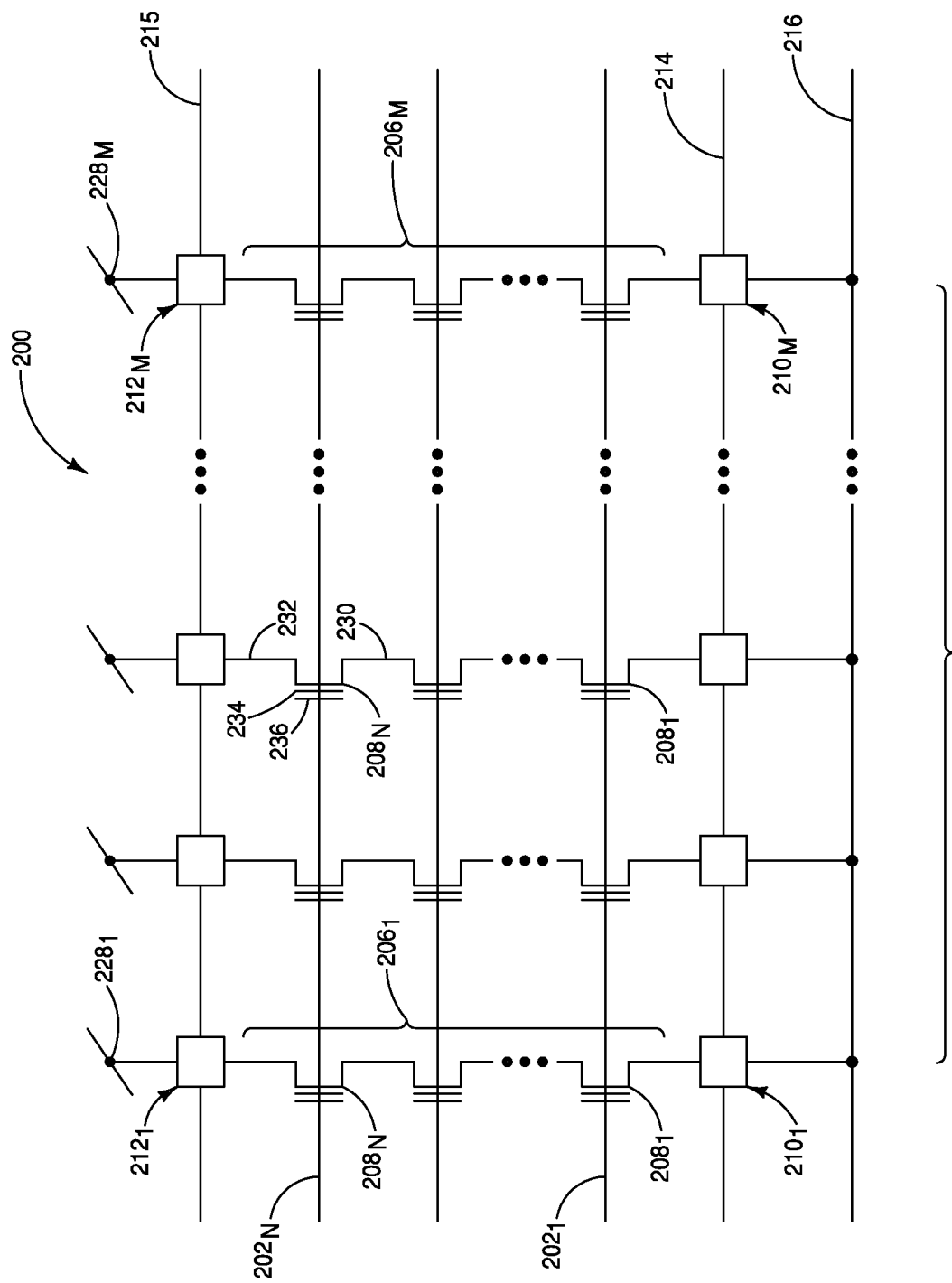
FIG. 4 is a schematic diagram of a prior art NAND memory array.
Figure 5:
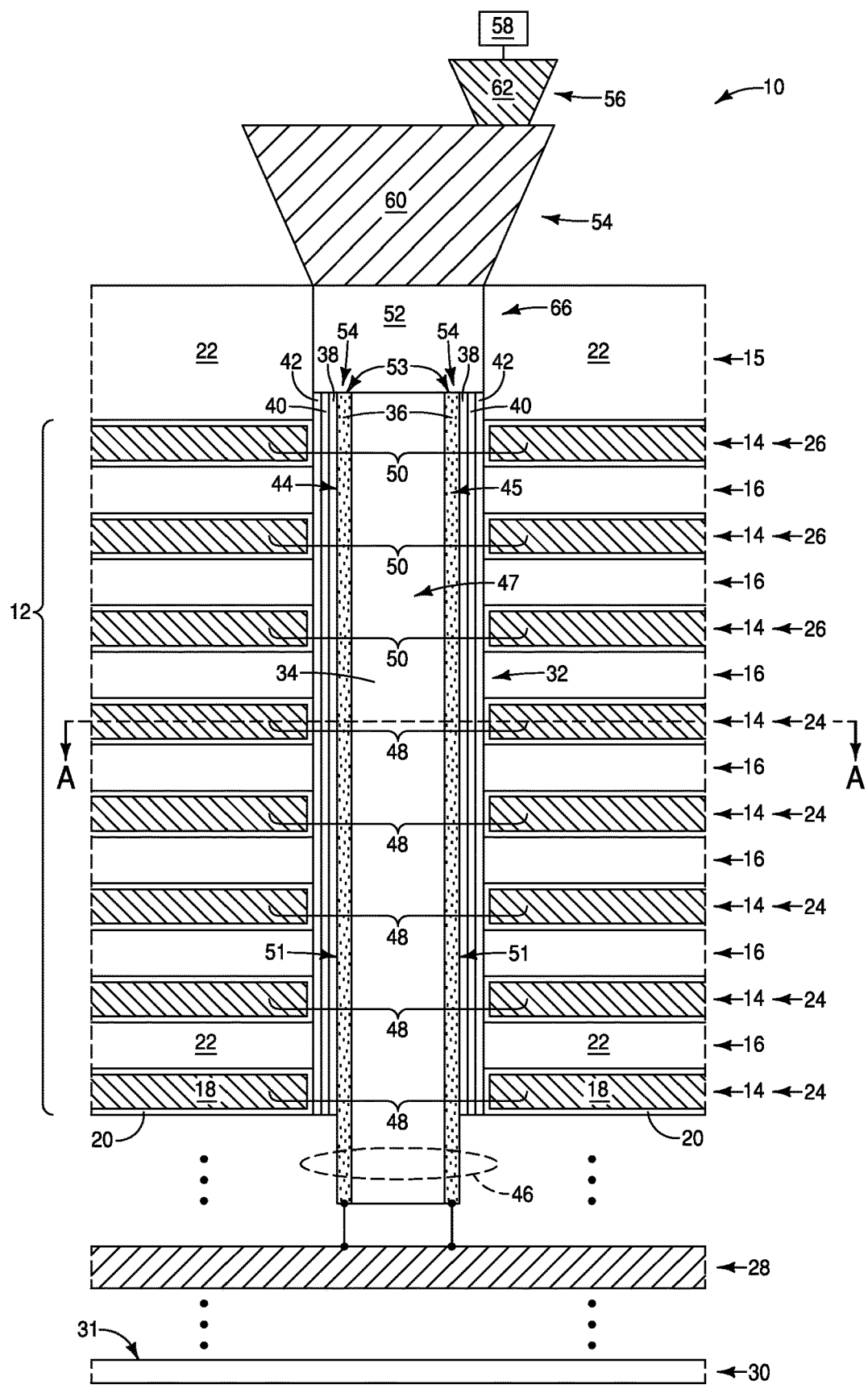
FIGS. 5 and 5A are a diagrammatic cross-sectional side view (FIG. 5) and a diagrammatic cross-sectional top-down view (FIG. 5A) of a region of an example integrated assembly comprising example memory cells along an example channel-material-pillar. The top-down view of FIG. 5A is along the line A-A of FIG. 5.

Referring to FIG. 5, a construction (i.e., assembly, architecture, etc.) 10 includes a stack 12 of alternating first and second levels 14 and 16, with such levels being supported over a source structure 28.

The first levels 14 comprise materials 18 and 20, with the material 18 being conductive and the material 20 being insulative. In some embodiments, the conductive material 18 may comprise two or more conductive compositions. For instance, the material 18 may comprise a metal-containing core and a metal nitride composition peripherally surrounding the core. The core composition may comprise, for example, tungsten, titanium, tantalum, etc. The metal nitride composition may comprise, for example, tungsten nitride, titanium nitride, etc. The insulative material 20 may comprise one or more high-k compositions (e.g., aluminum oxide, zirconium oxide, hafnium oxide, etc.), with the term "high-k" meaning a dielectric constant greater than that of silicon dioxide. In some embodiments, the insulative material 20 may correspond to a dielectric barrier material.

The second levels 16 comprise insulative material 22. The insulative material 22 may comprise any suitable composition(s), and in some embodiments may comprise, consist essentially of, or consist of silicon dioxide.

The levels 14 and 16 may be of any suitable thicknesses, and may be the same thickness as one another or different thicknesses relative to one another. In some embodiments, the levels 14 and 16 may have vertical thicknesses within a range of from about 10 nanometers (nm) to about 400 nm.

In the illustrated embodiment, an insulative level 15 is over the uppermost conductive level 14 of the stack 12. The insulative level 15 is vertically thicker than the other insulative levels 16. In some embodiments, the uppermost insulative level 15 may be at least about twice as thick as the other insulative levels 16. Although the stack 12 is shown to not include the uppermost insulative level 15, in other embodiments the stack 12 may be considered to include the level 15 in addition to the levels 14 and 16.

The insulative level 15 may comprise any suitable composition(s), and in the shown embodiment comprises the same insulative composition 22 as the other insulative levels 16.

In some embodiments, the stack 12 may be considered to comprise alternating conductive levels 14 and insulative levels 16. Some of the conductive levels 14 may correspond to a wordline/memory cell levels 24, and others may correspond to SGD levels 26. In the shown embodiment, the upper three of the conductive levels 14 are shown to correspond to SGD levels. Generally, one or more of the uppermost levels 14 will correspond to SGD levels. In some embodiments, the number of SGD levels will be within a range of from at least 1 to about 10. If multiple conductive levels are utilized as SGD levels, the conductive levels may be electrically coupled with one another (ganged together) to be incorporated into long-channel SGD devices.

There may be any suitable number of the wordline/memory cell levels 24. For instance, in some embodiments there may be 8 memory cell levels, 16 memory cell levels, 32 memory cell levels, 64 memory cell levels, 512 memory cell levels, 1024 memory cell levels, etc. The vertical stack 12 is diagrammatically indicated to extend downwardly beyond the illustrated region of the stack to indicate that there may be more vertically-stacked levels than those specifically illustrated in the diagram of FIG. 5.

The source structure 28 may comprise any suitable composition(s), and in some embodiments may comprise conductively-doped semiconductor material (e.g., conductively-doped silicon) over metal-containing material (with example metal-containing materials including one or more of tungsten, tungsten silicide, titanium, etc.).

The source structure 28 is shown to be supported by a base 30. The base 30 may comprise semiconductor material; and may, for example, comprise, consist essentially of, or consist of monocrystalline silicon. The base 30 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 30 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 30 and the source structure 28 to indicate that additional materials, components, etc., may be provided between the base 30 and the source structure 28 in some embodiments.

The base 30 is shown to have a horizontally-extending upper surface 31.

A cell-material-pillar 32 is shown to extend vertically through the stack 12. The cell-material-pillar 32 may be considered to be representative of a large number of substantially identical cell-material-pillars, with the term "substantially identical" meaning identical to within reasonable tolerances of fabrication and measurement. The pillars 32 may be configured in a tightly-packed arrangement, such as, for example, a hexagonal close packed (HCP) arrangement. There may be hundreds, thousands, millions, hundreds of thousands, etc., of the cell-material-pillars 32 extending through the stack 12.

The vertically-extending pillar 32 may extend at any suitable angle relative to the horizontally-extending upper surface 31 of the base 30. In some embodiments, the pillar 32 may be orthogonal, or at least substantially orthogonal, relative to the horizontally-extending surface 31, with the term "substantially orthogonal" meaning orthogonal to within reasonable tolerances of fabrication and measurement. In some embodiments, the pillar 32 may to extend within about ±15° of orthogonal relative to the horizontally-extending surface 31 of the base 30.

The pillar 32 comprises an insulative core material 34, a channel material 36, a tunneling material 38, a charge-storage material 40 and a charge-blocking material 42.

The channel material 36 is shown with stippling to assist the reader in identifying the channel material. The channel material 36 comprises semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material may comprise, consist essentially of, or consist of appropriately-doped silicon.

In some embodiments, the channel material 36 may comprise undoped semiconductor material, such as, for example, undoped silicon. The term "undoped" doesn't necessarily mean that there is absolutely no dopant present within the semiconductor material, but rather means that any dopant within such semiconductor material is present to an amount generally understood to be insignificant. For instance, undoped silicon may be understood to comprise a dopant concentration of less than about $10^{16}$ atoms/cm$^3$, less than about $10^{15}$ atoms/cm$^3$, etc., depending on the context. In some embodiments, the channel material 36 may comprise, consist essentially of, or consist of silicon. In some embodiments, the channel-material 36 may comprise silicon which is lightly-doped with appropriate n-type and/or p-type dopant (e.g., one or more of phosphorus, arsenic, boron, etc.), with a maximum total concentration of dopant within the channel material being less than or equal to about $10^{18}$ atoms/cm$^3$.

The semiconductor material within the channel material 36 may be referred to as a first semiconductor material to distinguish it from other semiconductor materials present within the integrated assembly 10.

Figure 5A:
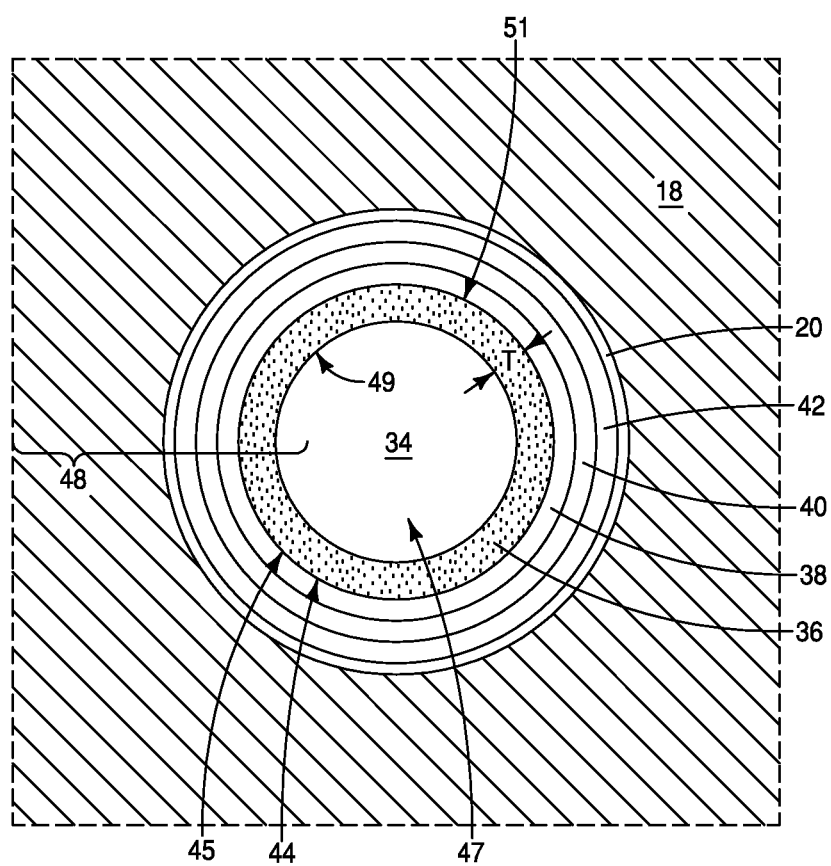

The channel material 36 may be considered to be configured as a channel-material-pillar 44. The pillar 44 may be configured in a hollow-pillar-configuration comprising a cylindrical wall 45 laterally surrounding a hollow 47, as shown. FIG. 5A shows a cross-section along the line A-A of FIG. 5, and shows the illustrated region of the channel-material-pillar 44 configured as a ring (annulus, donut-shape, annular-ring, etc.) along the top-down cross-section. Such ring may be considered to comprise the cylindrical wall 45 laterally surrounding the hollow 47. The cylindrical wall has an inner surface 49 along the hollow 47 and directly contacting the insulative material 34, and has an outer surface 51 directly contacting the tunneling material 38. The cylindrical wall has a lateral thickness T between the inner and outer walls 49 and 51. Such lateral thickness may be of any suitable dimension, and in some embodiments may be of a dimension which is within a range of from about 4 nm to about 30 nm.

Although the channel-material-pillar 44 is shown to be configured as a "hollow" channel configuration, in other embodiments the pillar 44 may be configured as a solid pillar rather than as a hollow pillar.

The tunneling material 38 (also referred to as gate dielectric material) may comprise any suitable composition(s), and in some embodiments may comprise one or more of silicon dioxide, aluminum oxide, hafnium oxide, zirconium oxide, etc.

The charge-storage material 40 may comprise any suitable composition(s), and in some embodiments may comprise floating gate material (e.g., polysilicon) or charge-trapping material (e.g., one or more of silicon nitride, silicon oxynitride, conductive nanodots, etc.).

The charge-blocking material 42 may comprise any suitable composition(s), and in some embodiments may comprise one or more of silicon dioxide, aluminum oxide, hafnium oxide, zirconium oxide, etc.

An SGS device 46 is shown to be associated with a lower region of the channel-material pillar 44 in the side view of FIG. 5. Also, the channel-material-pillar 44 is shown to be electrically coupled with the source structure 28. Memory cells 48 are along the memory cell levels 24, and SGD devices 50 are along the SGD levels 26.

Each of the memory cells 48 comprises a region of the semiconductor material (channel material) 36, and comprises regions (control gate regions) of the conductive levels 14. The regions of the conductive levels which are not comprised by the memory cells 48 may be considered to be wordline regions (routing regions) which couple the control gate regions with driver circuitry and/or other suitable circuitry. The memory cells 48 comprise the cell materials 38, 40, 42 and 20, in addition to comprising the channel material 36.

The memory cells 48 are vertically stacked one atop another.

In operation, the charge-storage material 40 may be configured to store information in the memory cells 50. The value (with the term "value" representing one bit or multiple bits) of information stored in an individual memory cell may be based on the amount of charge (e.g., the number of electrons) stored in a charge-storage region. The amount of charge within an individual charge-storage region may be controlled (e.g., increased or decreased), at least in part, based on the value of voltage applied to a gate, and/or based on the value of voltage applied to the channel.

The tunneling material 38 may be configured to allow desired tunneling (e.g., transportation) of charge (e.g., electrons) between the charge-storage material 40 and the channel material 36. The tunneling material 38 may be configured (i.e., engineered) to achieve a selected criterion, such as, for example, but not limited to, an equivalent oxide thickness (EOT). The EOT quantifies the electrical properties of the tunneling region (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 42 is adjacent to the charge-storage material 40, and may provide a mechanism to block charge from flowing from the charge-storage material 40 to the gates along conductive levels 14.

The dielectric barrier material 20 is provided between the charge-blocking material 42 and the associated gates along the conductive levels 14, and may be utilized to inhibit back-tunneling of electrons from the gates toward the charge-storage material 40.

A second semiconductor material 52 is over the cell-material-pillar 32, and directly contacts an upper region of the channel-material-pillar 44. In the illustrated embodiment, the second semiconductor material 52 directly contacts an upper surface 53 of the channel-material-pillar 44. In some embodiments, the second semiconductor material 52 may be considered to be configured as a semiconductor-material-plug 66.

In some embodiments, the first and second semiconductor materials 36 and 52 comprise a same composition as one another. For instance, the first and second semiconductor materials 36 and 52 may both comprise silicon. The silicon within the second semiconductor material 52 may be in any suitable phase, and in some embodiments may be in one or both of an amorphous phase and a polycrystalline phase.

The second semiconductor material 52 has a higher dopant concentration than the first semiconductor material 36 (i.e., the channel material). In some embodiments, the second semiconductor material 52 may comprise silicon having a total dopant concentration of one or more suitable n-type and/or p-type dopants (e.g., phosphorus, boron, arsenic, etc.) of greater than or equal to about $10^{20}$ atoms/cm$^3$, greater than or equal to about $10^{21}$ atoms/cm$^3$, etc.

The first and second semiconductor materials 36 and 52 join to one another along an interfacial region 54. In the illustrated embodiment of FIG. 5, such interfacial region is coextensive with the upper surface 53 of the channel-material-pillar 44.

The interfacial region 54 is above the SGD levels 26.

In operation, the memory cells 48 may be block-erased utilizing GIDL established by the SGS and SGD devices (46 and 50). A difficulty which may be encountered in conventional NAND-memory configurations is that there may be a dopant gradient along an upper region of the channel material within the channel-material pillars, with such gradient being a suboptimal dopant profile for GIDL generation. Instead, it is desired to have a dopant profile corresponding to a uniform and consistent dopant concentration throughout the entirety of the channel material 36, and to have an abrupt interface between the low-dopant-concentration-semiconductor-material 36 and the high-dopant-concentration-semiconductor-material 52. The structure of FIG. 5 may have the desired dopant profile. The concept of an abrupt interface between a low-dopant-concentration-semiconductor-material and a high-dopant-semiconductor-material is described in more detail below with reference to FIGS. 7A and 7B.

Referring still to FIG. 5, a first conductive interconnect 54 is provided over the semiconductor material 52 and is electrically coupled with the semiconductor material 52. A second conductive interconnect 56 is provided over the first conductive interconnect 54 and is electrically coupled with the first conductive interconnect 54. A bitline (digit line, sense line, etc.) 58 is provided over the interconnect 56 and is electrically coupled with the interconnect 56. Accordingly, the bitline 58 is electrically coupled with the channel material 36 through the semiconductor material 52 and the interconnects 54 and 56.

The bitline 58 may extend in and out of the page relative to the cross-sectional view of FIG. 5.

The interconnects 54 and 56 comprise conductive materials 60 and 62, respectively. The materials 60 and 62 may comprise any suitable electrically conductive composition (s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the materials 60 and 62 may both be metal-containing materials (e.g., may comprise one or more of tungsten, titanium, tungsten nitride, titanium nitride, etc.). The materials 60 and 62 may be compositionally the same as one another, or may be compositionally different relative to one another.

Figure 6:
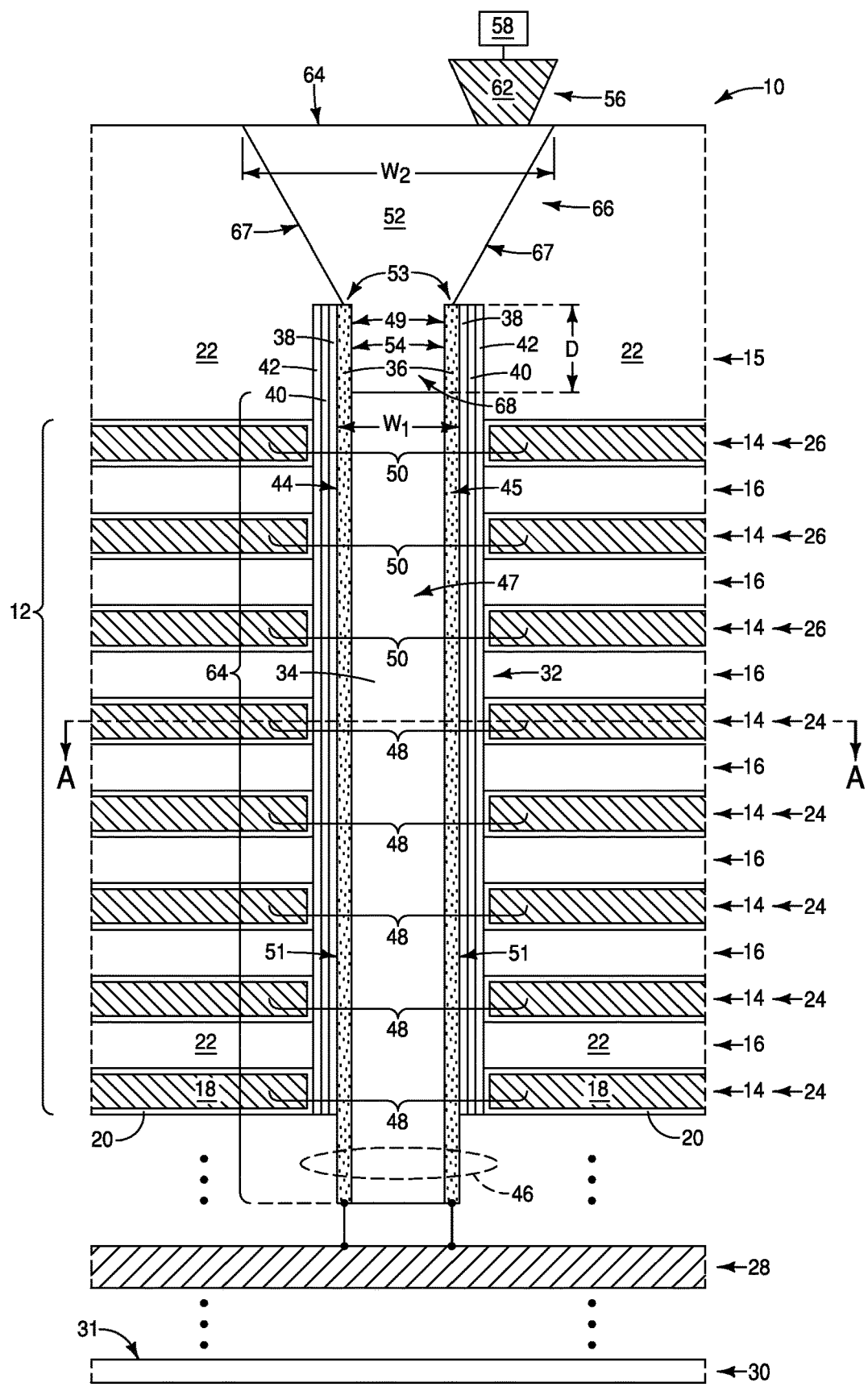
FIG. 6 is a diagrammatic cross-sectional side view of a region of an example integrated assembly comprising example memory cells along an example channel-material-pillar. A view along the line A-A of FIG. 6 may be the same as the cross-sectional top-down view of FIG. 5A.

FIG. 6 shows another embodiment of an integrated assembly having the second semiconductor material 52 over the channel material 36 of the channel-material-pillar 44. The top-down cross-sectional view along the line A-A of FIG. 6 will be identical to FIG. 5A.

FIG. 6 shows the insulative material (dielectric material) 34 filling only a lower region 64 of the hollow 47. The semiconductor material 52 of the semiconductor-material-plug 66 extends into an upper region 68 of the hollow.

The interfacial region 54 between the first and second semiconductor materials 36 and 52 includes a portion of the upper surface 53, and includes a portion of the inner surface 49 of the cylindrical wall 45 within the upper region 68 of the hollow 47.

In the shown embodiment, the semiconductor-material-plug 66 is configured to include tapered sidewalls 67 which extend to an uppermost surface 64. In some embodiments, the channel-material-pillar 44 may be considered to have a first lateral width $W_1$ along the cross-section of FIG. 6, and the uppermost surface 64 of the plug 66 may be considered to have a second lateral width $W_2$ along the cross-section, with the second lateral width being greater than the first lateral width. In some embodiments, the second lateral width may be large enough that the interconnect 54 of FIG. 5 may be omitted, and instead only the interconnect 56 extends between the plug 66 and the bitline 58 (as shown).

The plug 66 is shown to be directly against a portion of the uppermost surface 53 of the channel-material-pillar 44, and the material 22 is directly against another portion of the uppermost surface 53 of the channel-material-pillar. In other embodiments, the plug 66 may extend entirely across the uppermost surface 53 of the channel-material-pillar or may not extend across any of the uppermost surface 53 of the channel-material-pillar.

The upper region 68 of the hollow 47 may have any suitable vertical dimension D, and in some embodiments may have a vertical dimension of at least about 20 nm, at least about 40 nm, etc.

Figure 7A:
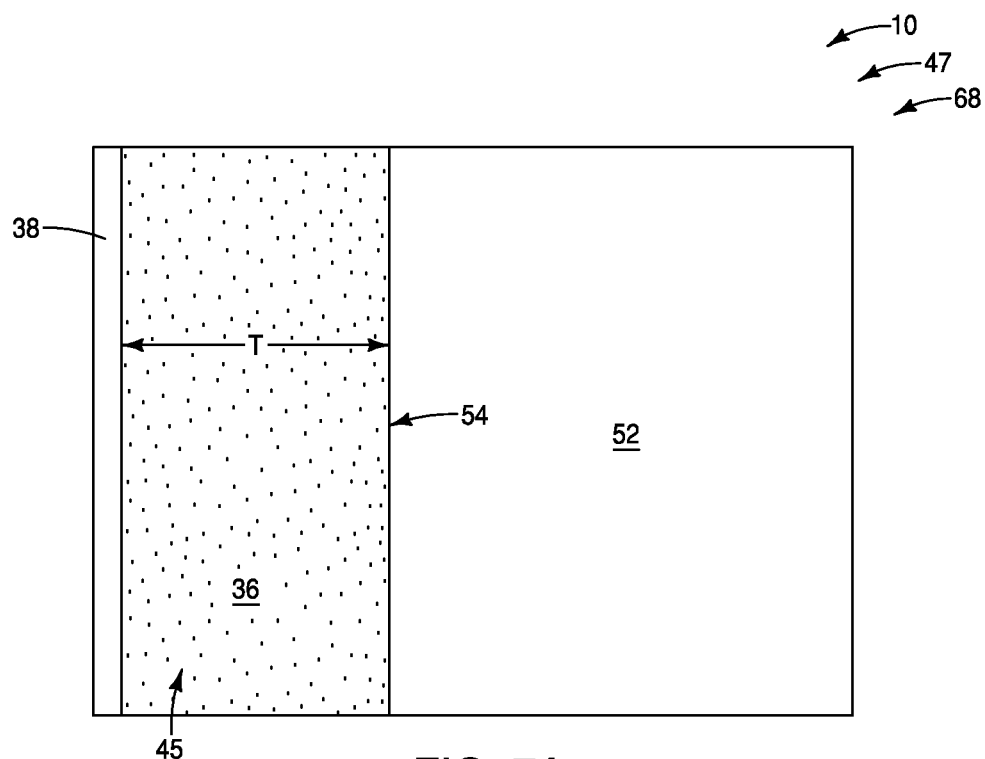
FIGS. 7A and 7B are diagrammatic cross-sectional side views of regions of example integrated assembly showing heavily-doped semiconductor material directly adjacent to less-doped semiconductor material.
Figure 7B:
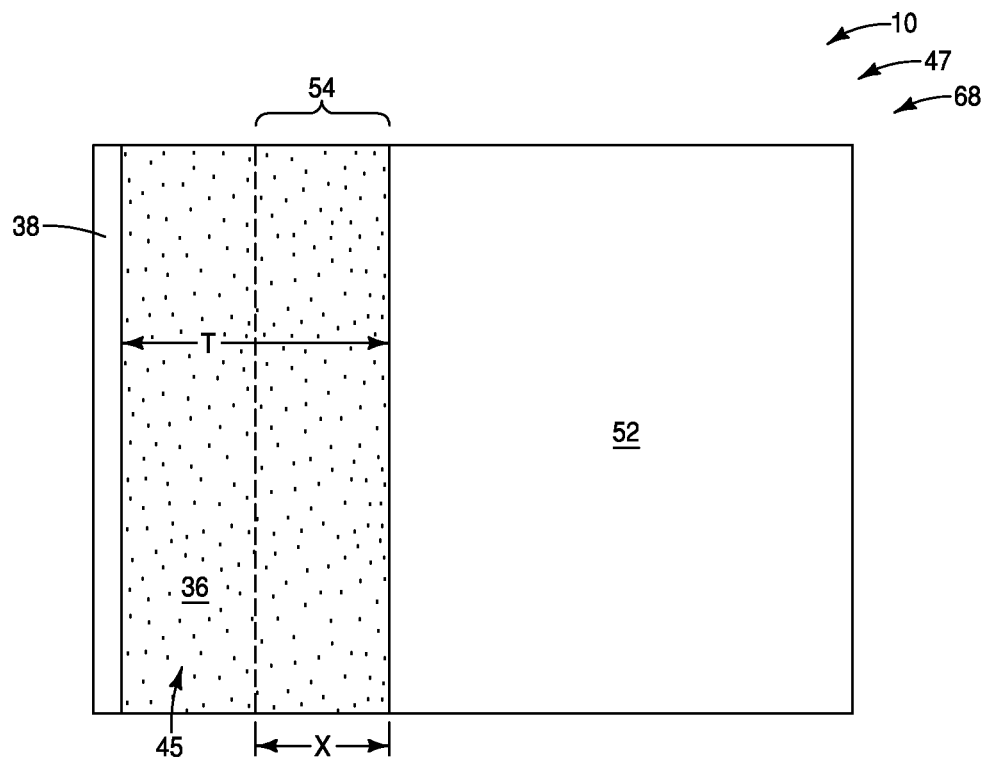

In some embodiments, an advantage of the assemblies of FIGS. 5 and 6 is that there will be little, if any, intermixing of dopant from the second semiconductor material 52 into the first semiconductor material 36 (i.e., from the heavily-doped conductive interconnect material 52 into the undoped, or lightly-doped, channel material 36). FIGS. 7A and 7B diagrammatically illustrate example embodiments in which there is little or no intermixing of dopant from the heavily-doped material 52 into the channel material 36.

FIG. 7A shows a region of the construction of FIG. 6 having the channel material 36 (illustrated with stippling) adjacent to the heavily-doped semiconductor material 52 within the upper portion 68 of the hollow 47. The tunneling material 38 is shown to be on an opposite side of the channel material 36 from the heavily-doped semiconductor material 52. The channel material 36 has the lateral thickness T between the materials 52 and 38, with an example lateral thickness T being within a range of from greater than or equal to about 4 nm to less than or equal to about 30 nm. FIG. 7A may be considered to illustrate an embodiment in which there is no intermixing of dopant from the heavily-doped material 52 into the channel material 36. Accordingly, the interfacial region 54 is simply a boundary between the materials 52 and 36.

In contrast, FIG. 7B illustrates a configuration similar to that of FIG. 7A, but in which there is a little mixing of dopant from the material 52 into the material 36, and accordingly in which the interfacial region 54 extends a distance X into the channel material 36. The distance X is less than the full lateral thickness T of the cylindrical wall 45 comprising the channel material 36, and in some embodiments may be less than or equal to about 50% of the lateral thickness T, less than or equal to about 20% of such lateral thickness, less than or equal to about 10% of such lateral thickness, less than or equal to about 5% of such lateral thickness, etc. In some embodiments, any mixing of dopant from the second semiconductor material 52 into the channel material 36 will be less than or equal to about one-third of the lateral thickness T, less than or equal to about one-fourth of such lateral thickness, etc. In some embodiments, any mixing of dopant from the second semiconductor material 52 into the first semiconductor material 36 will extend less than or equal to about 20 nm into the channel material, less than or equal to about 5 nm into the channel material, less than or equal to about 2 nm into the channel material, etc.

It is desired that there be little mixing of dopant from the heavily-doped material 52 into the channel material 36 in order to avoid the problems with GIDL described above as being problematically associated with conventional configurations having suboptimal dopant profiles along the channel material 36. It can be particularly desired that any mixing of dopant from the heavily-doped material 52 into the channel material 56 does not extend entirely across the lateral sidewall of the material 36 relative to the embodiment of FIG. 6 in which the material 52 extends into the upper region 68 of the hollow 47. In contrast, in the embodiment of FIG. 5 in which the second material 52 extends entirely across the upper surface 53 of the channel material 36, it can simply be desired that there be either no detectable mixing of dopant from the material 52 into the channel material 36, or that any mixing be limited to a region above the uppermost SGD level 26, and preferably be limited to extend less than or equal to about 10 nm into the channel material 36, less than or equal to about 5 nm into the channel material, less than or equal to about 2 nm into the channel material, etc.

The configurations of FIGS. 5 and 6 may be formed with any suitable processing. FIGS. 8-13 describes example processing for forming the configuration of FIG. 6.

Figure 8:
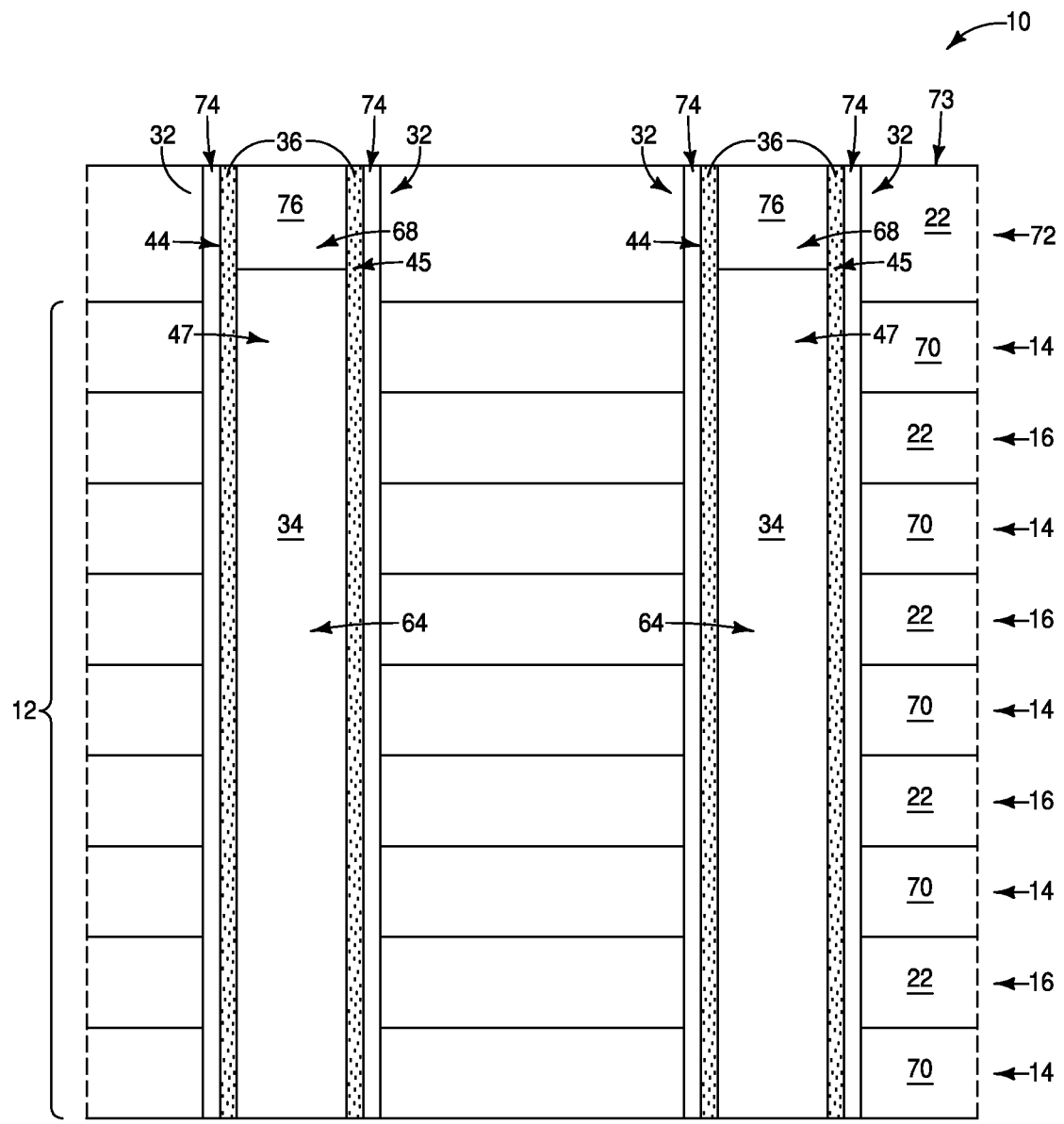
FIGS. 8-13 are diagrammatic cross-sectional side views of regions of an example integrated assembly at example sequential process stages of an example method.

Referring to FIG. 8, a region of the assembly 10 is shown at an example process stage. The source structure 28 and the base 30 are not shown in FIG. 8 in order to simplify the drawing.

The assembly 10 includes a stack 12 of alternating first and second levels 14 and 16. The second levels 16 comprise the insulative material 22 described above. The first levels 14 comprise a sacrificial material 70. The sacrificial material 70 may comprise any suitable composition(s), and in some embodiments may comprise, consist essentially of, or consist of silicon nitride. The material 22 may be referred to as a first insulative material to distinguish it from other insulative materials, and the sacrificial material 70 may be referred to as a first sacrificial material to distinguish it from other sacrificial materials.

A thick layer 72 of the material 22 is formed over the stack 12. In some embodiments, the thick layer 72 may be considered to be part of the stack 12.

Cell-material-pillars 32 are formed to extend through the stack 12 and the layer 72. The cell-material-pillars comprise the channel-material-pillars 44 configured as hollow cylinders. The hollow cylinders have the cylindrical sidewalls 45 surrounding the hollows 47. The insulative material 34 fills the lower regions 64 of the hollows 47. In some embodiments, the insulative material 34 may be referred to as a second insulative material.

The cell-material-pillars 32 include regions 74 outwardly of the channel material 36 and laterally surrounding the channel material. The regions 74 may include the tunneling material, charge-storage material and a charge-blocking material described above with reference to FIG. 5. The tunneling material, charge-storage material and a charge-blocking material may be collectively referred to as cell materials.

Sacrificial material 76 is formed within the upper regions 68 of the hollows 47. The sacrificial material 76 may be referred to as second sacrificial material. The sacrificial material 76 may comprise any suitable composition(s), and in some embodiments may comprise one or more of silicon nitride, carbon (e.g., amorphous carbon), carbon-doped silicon dioxide, metal, aluminum oxide, etc.

A planarized surface 73 is formed to extend across the layer 72, the pillars 32 and the sacrificial material 76. The planarized surface 73 may be formed with any suitable processing, including, for example, chemical-mechanical polishing (CMP). In some embodiments, the layer 72 may be considered to be an uppermost of the insulative levels (second levels) 14, and accordingly the planarized surface 73 may be considered to extend across such uppermost of the second levels.

Figure 9:
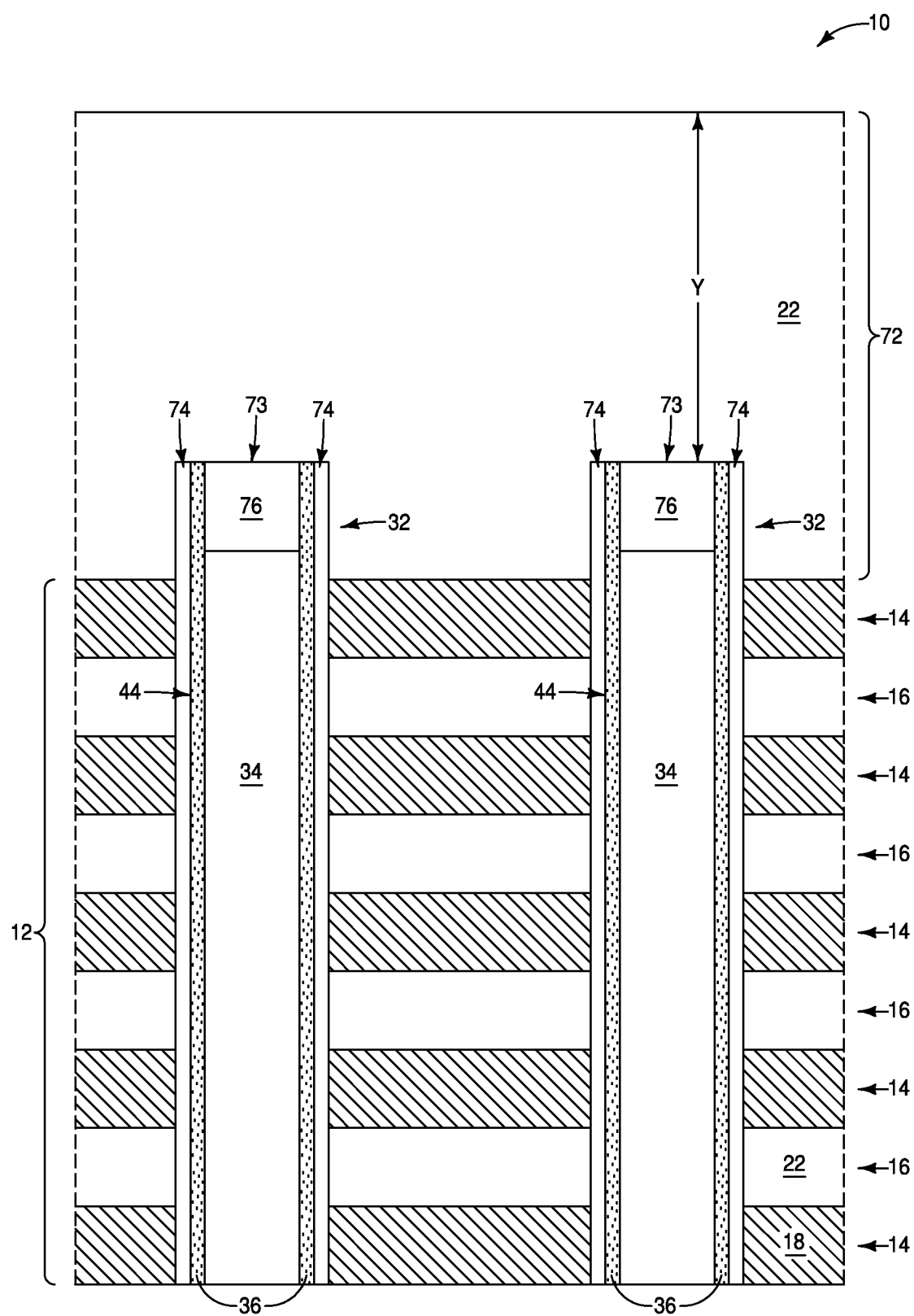

Referring to FIG. 9, additional insulative material 22 is formed over the layer 72 to increase a vertical thickness of the layer 72, and in some embodiments may be considered to be formed across the planarized surface 73 (FIG. 8). Although the same material 22 is shown to be formed over the planarized surface 73 as is utilized within the layer 72 of FIG. 8, in other embodiments a different insulative material may be formed over the planarized surface 73 than is utilized within the layer 72. The additional material formed over the planarized surface 73 may be referred to as a third insulative material in some embodiments.

In some embodiments, the layer 72 of FIG. 9 may have a thickness which extends over the cell-material-pillars 32 by a distance Y of at least about 100 nm, and in some embodiments such distance Y may be within a range of from about 100 nm to about 1 micron (μm).

The sacrificial material 70 of FIG. 8 is removed and replaced with the conductive material 18 to form the conductive levels 14 described above with reference to FIGS. 5 and 6. Although the dielectric barrier material 20 is not shown in FIG. 9, it is to be understood that such material may be formed within the levels 14 in addition to the conductive material 18. If the dielectric barrier material is within the regions 74 of the cell-material-pillars, then the sacrificial material 70 (FIG. 8) may be removed and replaced entirely with the conductive material 18. Alternatively, if it is desired to form the dielectric barrier material along the levels 14, then the sacrificial material 70 (FIG. 8) may be removed and replaced with both the conductive material 18 and the dielectric barrier material 20 (to form a configuration analogous to that shown in FIG. 5).

The sacrificial material 70 (FIG. 8) may be removed by forming slits (not shown) through the stack 12 to expose regions of the levels 14 and 16, and then selectively removing the sacrificial material 70 relative to other exposed materials. Subsequently, appropriate materials and/or precursors may be flowed into the slits to form the conductive material 18 (and also possibly the dielectric barrier material 20) along the levels 14.

Figure 10:
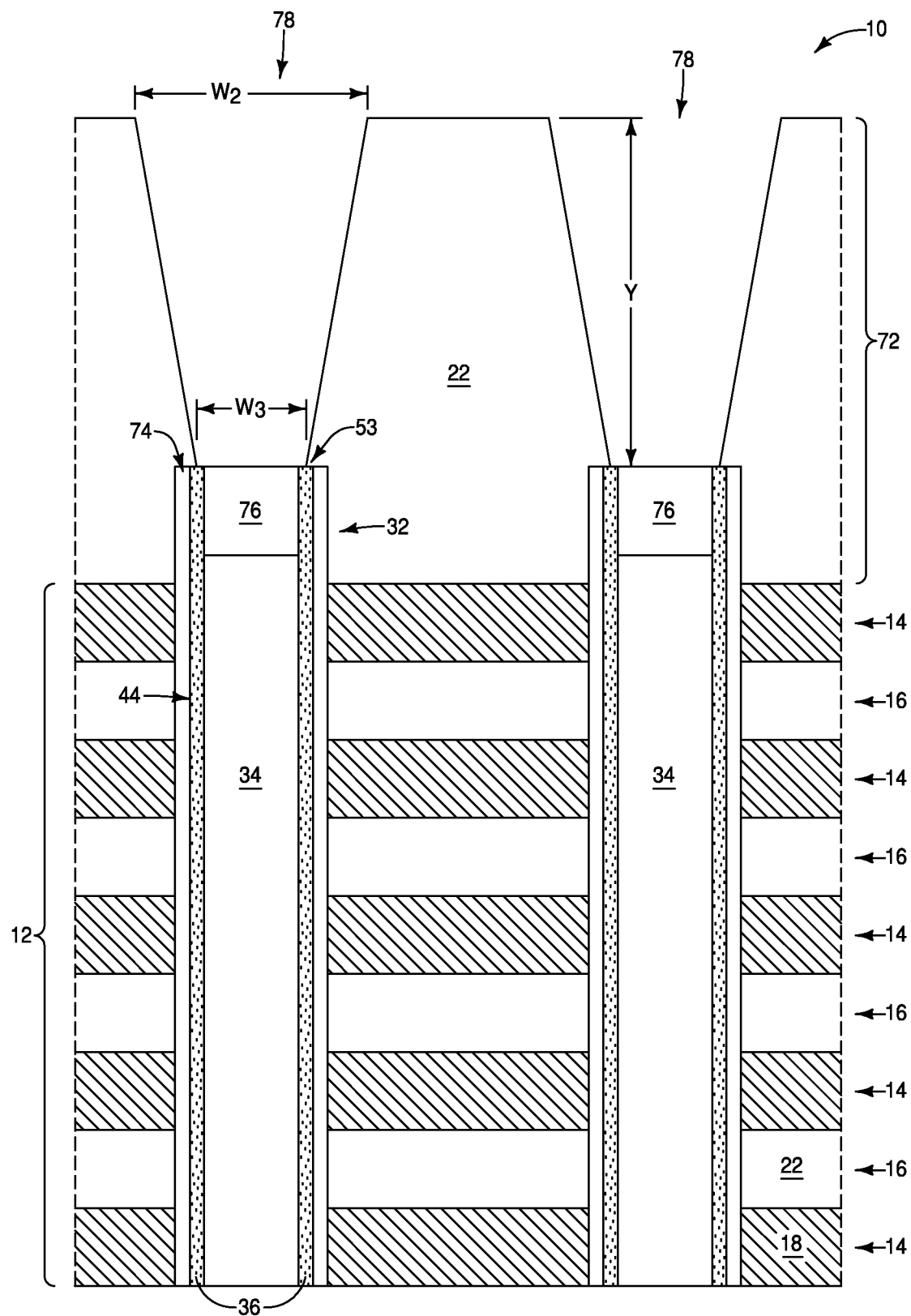

Referring to FIG. 10, openings 78 are formed to expose the sacrificial material 76. The openings 78 may have depths corresponding to the dimension Y, and accordingly may have depths within the range of from about 100 nm to about 1 μm. The openings 78 may have bottom widths $W_3$ along the cross-section of FIG. 10 within a range of from about 50 nm to about 100 nm, and may have top widths $W_2$ along the cross-section of FIG. 10 within a range of from about 100 nm to about 200 nm.

In the illustrated embodiment, outer edges of the openings 78 land on upper surfaces 53 of the channel material 36. In other embodiments, the openings may have narrower bottom widths such that the outer edges of the openings land on the sacrificial material 76, or may have wider bottom widths such that the outer edges of the openings land on the cell materials within the regions 74, or even land outwardly of the regions 74 and within the insulative material 22 of the layer 72.

The flexibility associated with the landing regions of the openings 78 may be advantageous during fabrication of an integrated assembly 10 in that such may provide tolerance to compensate for mask misalignment that may occur during such fabrication.

Figure 11:
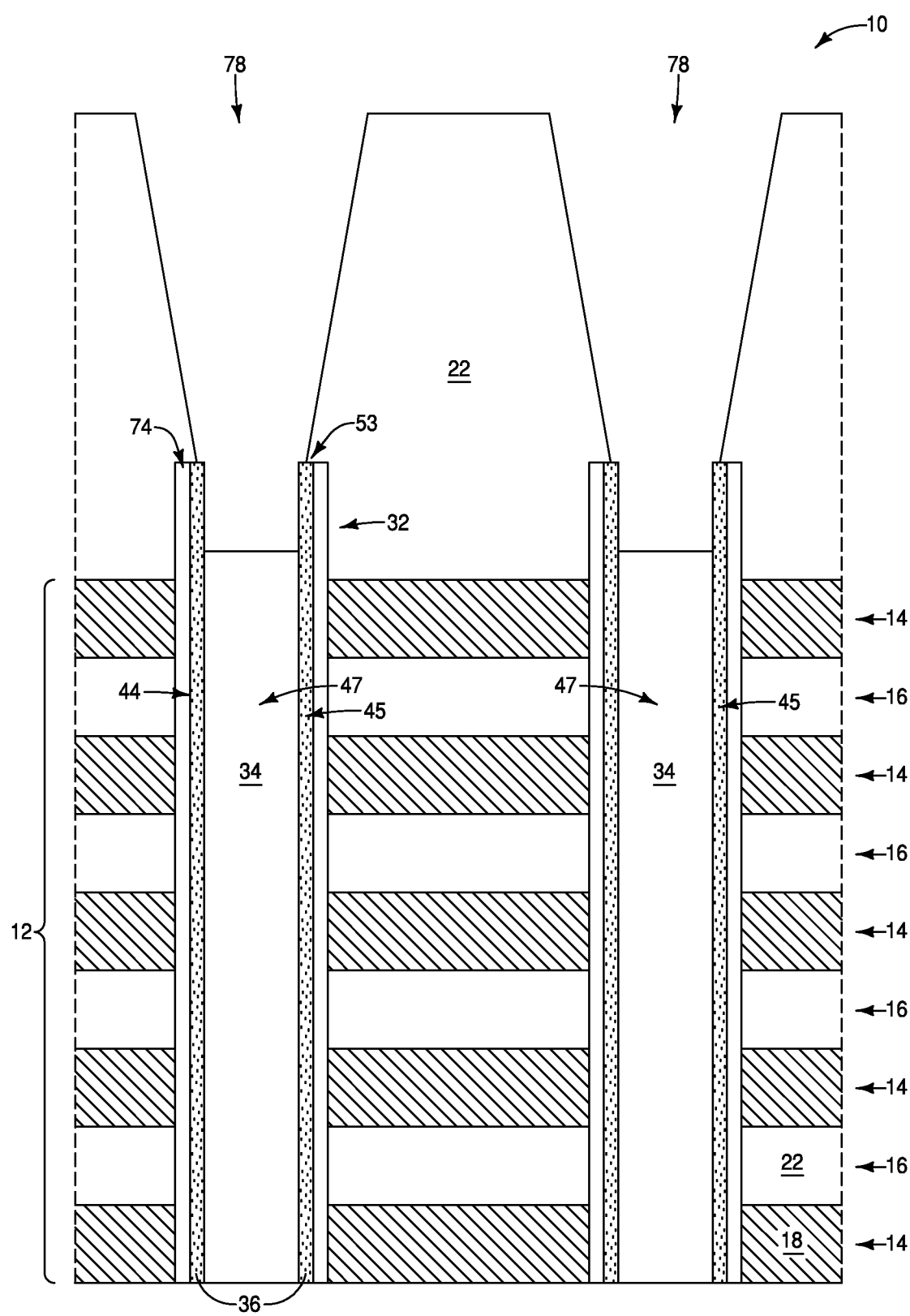

Referring to FIG. 11, the insulative material 76 (FIG. 10) is removed to extend the openings 78 to upper surfaces of the insulative material 34 within the hollows 47 defined by the cylindrical walls 45 of the channel-material-pillars 44.

Figure 12:
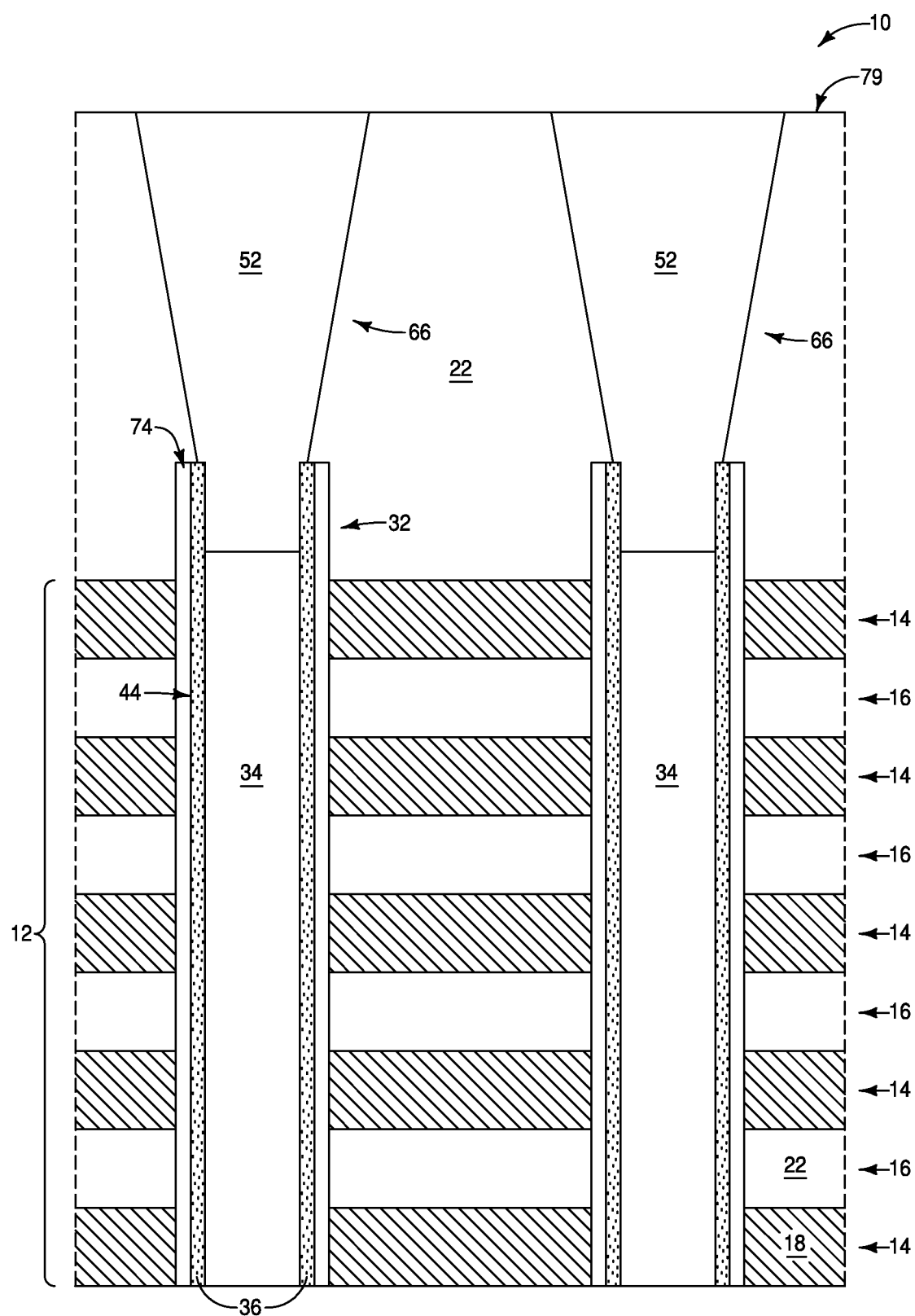

Referring to FIG. 12, the heavily-doped semiconductor material 52 is formed within the openings 78 (FIG. 11), and then a planarized surface 79 is formed to extend across the materials 22 and 52. The surface 79 may be formed with any suitable processing, including, for example, CMP.

The material 52 of FIG. 12 is configured as conductive plugs 66 analogous to the plug described above with reference to FIG. 6.

Figure 13:
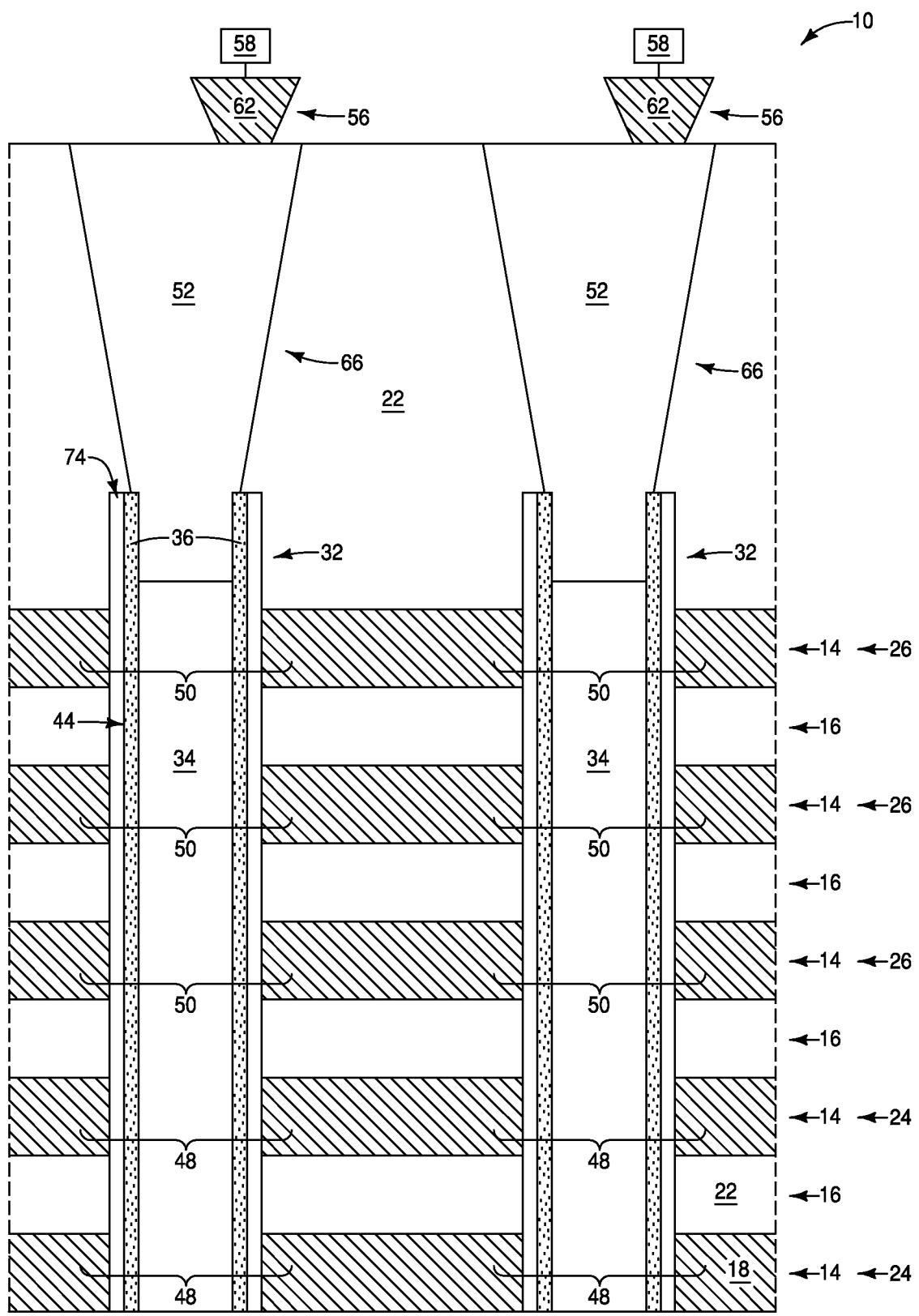

Referring to FIG. 13, interconnects 56 and bitlines 58 are formed over the conductive plugs 66. The bitlines 58 are coupled to the channel material 36 of the channel-material-pillars 44 through the interconnects 56 and the conductive plugs 66.

The configuration of FIG. 13 may be considered to be analogous to that described above with reference to FIG. 6.

The memory cells 48 and SGD devices 50 are associated with the conductive levels 14, and are along regions of the cell-material-pillars 32.

In some embodiments, any high-temperature thermal processing (e.g., thermal processing utilizing temperatures in excess of 1000° C.) may be conducted prior to forming the semiconductor material 52. Accordingly, interfaces between the semiconductor materials 52 and 36 will not be subjected to thermal stresses which may inadvertently cause undesired intermixing of dopant from the material 52 into the material 36. In some embodiments, it may be desired to anneal the material 52 to activate dopant within such material. Such annealing may be conducted with relatively low-temperature thermal processing (e.g., thermal processing utilizing a maximum temperature of less than or equal to about 600° C.). In some embodiments, the conductive plugs 66 of FIG. 12 may be exposed to suitable low-temperature thermal processing to activate dopant (e.g., phosphorus) within the heavily-doped semiconductor material 52 without substantially intermixing dopant from the material 52 into the channel material 36.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a channel-material-pillar extending vertically through a stack of alternating conductive levels and insulative levels. The channel-material-pillar includes a first semiconductor material. A second semiconductor material is directly against an upper region of the channel-material-pillar. The second semiconductor material has a higher dopant concentration than the first semiconductor material and joins to the first semiconductor material along an abrupt interfacial region such that there is little or no mixing of dopant from the second semiconductor material into the first semiconductor material.

Some embodiments include an integrated assembly comprising a channel-material-pillar extending vertically through a stack of alternating conductive levels and insulative levels. The channel-material-pillar comprises a first semiconductor material. The channel-material-pillar has a hollow-pillar-configuration comprising a cylindrical wall laterally surrounding a hollow. The cylindrical wall has an inner surface along the hollow, and has a lateral thickness. A dielectric material fills a lower region of the hollow. An upper region of the hollow is above said lower region. A semiconductor-material-plug is over the stack and extends into the upper region of the hollow. The semiconductor-material-plug comprises a second semiconductor material. The second semiconductor material of the semiconductor-material-plug is directly against the inner surface of the cylindrical wall along the upper region of the hollow. The second semiconductor material has a higher dopant concentration than the first semiconductor material. Any intermixing of dopant from the second semiconductor material into the first semiconductor material extends less than the lateral thickness of the cylindrical wall.

Some embodiments include a method of forming an integrated assembly. A stack is formed to comprise alternating first and second levels. The first levels comprise first sacrificial material and the second levels comprise first insulative material. Pillars are formed to extend through the stack. The pillars include cell materials, channel material and second insulative material. The channel material is configured as hollow cylinders having cylindrical sidewalls surrounding hollows. The second insulative material fills lower regions of the hollows. The cell materials laterally surround the hollow cylinders. Second sacrificial material is formed within upper regions of the hollow cylinders. At least some of the first sacrificial material of the first levels is replaced with conductive material. A planarized surface is formed to extend across an uppermost of the second levels, across the pillars and across the second sacrificial material.

A third insulative material is formed over the planarized surface. Openings are formed to extend through the third insulative material to the second sacrificial material. The second sacrificial material is removed to extend the openings to upper surfaces of the second insulative material. Conductive plugs are formed within the extended openings. The conductive plugs comprise doped-semiconductor-material. Bitlines are formed to be coupled with the channel material of the pillars through the conductive plugs.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a channel-material-pillar extending vertically through a stack of alternating conductive levels and insulative levels; the channel-material-pillar comprising a first semiconductor material; the first semiconductor material extending below the alternating conductive levels and the insulative levels, the channel-material-pillar defining a hollow filled with insulative material; and
   a second semiconductor material directly against an upper region of the channel-material-pillar; the second semiconductor material having a higher dopant concentration than the first semiconductor material along an abrupt interfacial region.

2. The integrated assembly of claim 1 wherein the first and second semiconductor materials comprise a same semiconductor composition as one another.

3. The integrated assembly of claim 1 wherein the first and second semiconductor materials both comprise silicon.

4. The integrated assembly of claim 1 wherein the second semiconductor material is in both of an amorphous phase and a polycrystalline phase.

5. The integrated assembly of claim 1 wherein one or more of the upper conductive levels of the stack are SGD levels, and wherein the interfacial region is above an uppermost of the SGD levels.

6. The integrated assembly of claim 1 wherein the first semiconductor-material is silicon having any dopant therein to a total dopant concentration of less than or equal to $1 \times 10^{18}$ atoms/cm$^3$.

7. The integrated assembly of claim 1 wherein the first semiconductor-material is silicon having any dopant therein to a total dopant concentration of less than or equal to $1 \times 10^{16}$ atoms/cm$^3$.

8. The integrated assembly of claim 1 wherein the second semiconductor-material is silicon having a total dopant concentration of greater than or equal to $1 \times 10^{20}$ atoms/cm$^3$.

9. The integrated assembly of claim 1 wherein the second semiconductor-material is silicon having a total dopant concentration of greater than or equal to $1 \times 10^{21}$ atoms/cm$^3$.

10. The integrated assembly of claim 1 wherein the second semiconductor material is in an amorphous phase.

11. The integrated assembly of claim 1 wherein the first semiconductor material comprises one or more of germanium, III/V semiconductor material and semiconductor oxide.

12. The integrated assembly of claim 1 wherein the first semiconductor material comprises one of the following dopant concentrations:
   less than about $10^{16}$ atoms/cm$^3$;
   less than about $10^{15}$ atoms/cm$^3$; or
   less than or equal to about $10^{18}$ atoms/cm$^3$.

13. An integrated assembly, comprising:
   a channel-material-pillar extending vertically through a stack of alternating conductive levels and insulative levels; the channel-material-pillar comprising a first semiconductor material; and
   a second semiconductor material directly against an upper region of the channel-material-pillar; the first and second semiconductor materials being doped, the second semiconductor material having a higher dopant concentration than the first semiconductor material and joining to the first semiconductor along an abrupt interfacial region such that there is little to no mixing of dopant from the second semiconductor material into the first semiconductor material, wherein other than the second semiconductor material, only insulative material surrounds an upper region of the channel-material-pillar; and
   wherein the first semiconductor material comprises at least semiconductor oxide.

14. The integrated assembly of claim 13 wherein the first and second semiconductor materials comprise a same semiconductor composition as one another.

15. The integrated assembly of claim 13 wherein the first and second semiconductor materials both comprise silicon.

16. The integrated assembly of claim 13 wherein the second semiconductor material is in both of an amorphous phase and a polycrystalline phase.

17. The integrated assembly of claim 13 wherein one or more of the upper conductive levels of the stack are SGD levels, and wherein the interfacial region is above an uppermost of the SGD levels.

18. The integrated assembly of claim 13 wherein the first semiconductor-material is silicon having any dopant therein to a total dopant concentration of less than or equal to $1 \times 10^{18}$ atoms/cm$^3$.

19. The integrated assembly of claim 13 wherein the first semiconductor-material is silicon having any dopant therein to a total dopant concentration of less than or equal to $1 \times 10^{16}$ atoms/cm$^3$.

20. The integrated assembly of claim 13 wherein the second semiconductor material is in an amorphous phase.

21. The integrated assembly of claim 13 wherein the first semiconductor material comprises one of the following dopant concentrations:
   less than about $10^{16}$ atoms/cm$^3$,
   less than about $10^{15}$ atoms/cm$^3$:
   less than or equal to about $10^{18}$ atoms/cm$^3$.

22. The integrated assembly of claim 13 wherein dopant from the second semiconductor material extends into the first semiconductor material to one of the following distances:
   less than or equal to about 10 nm into the first semiconductor material;
   less than or equal to about 5 nm into the first semiconductor material; or
   less than or equal to about 2 nm into the first semiconductor material.

23. An integrated assembly, comprising:
   a channel-material-pillar extending vertically through a stack of alternating conductive levels and insulative levels; the channel-material-pillar comprising a first semiconductor material; and
   a second semiconductor material directly against an upper region of the channel-material-pillar; the second semiconductor material having a higher dopant concentration than the first semiconductor material and joining to the first semiconductor along an abrupt interfacial region such that there is little to no mixing of dopant from the second semiconductor material into the first semiconductor material, wherein other than the second semiconductor material, only insulative material surrounds an upper region of the channel-material-pillar; and wherein the second semiconductor-material is silicon having a total dopant concentration of greater than or equal to $1\times10^{20}$ atoms/cm$^3$.

24. The integrated assembly of claim 23 wherein the second semiconductor-material has a total dopant concentration of greater than or equal to $1\times10^{21}$ atoms/cm$^3$.

25. The integrated assembly of claim 1 wherein the channel-material-pillar comprises a horizontal width that equals a horizontal width of the second semiconductor material.

26. The integrated assembly of claim 1 wherein, in a vertical cross section, the channel-material-pillar comprises opposite sidewalls collinear with opposite sidewalls of the second semiconductor material.

27. The integrated assembly of claim 1 further comprising a conductive interconnect over and against the second semiconductor material, the conductive interconnect comprising a trapezoid shape.

28. The integrated assembly of claim 1 further comprising a conductive interconnect over and against the second semiconductor material, the conductive interconnect comprising a metal-containing material.

29. The integrated assembly of claim 28 wherein the conductive interconnect comprises a first conductive interconnect, and further comprising a second conductive interconnect over and against the first conductive interconnect.

30. The integrated assembly of claim 1 further comprising:
a conductive interconnect over the second semiconductor material; and
a bit line over and against the conductive interconnect.

31. The integrated assembly of claim 13 wherein the channel-material-pillar comprises a horizontal width that equals a horizontal width of the second semiconductor material.

32. The integrated assembly of claim 13 wherein, in a vertical cross section, the channel-material-pillar comprises opposite sidewalls collinear with opposite sidewalls of the second semiconductor material.

33. The integrated assembly of claim 13 further comprising a conductive interconnect over and against the second semiconductor material, the conductive interconnect comprising a trapezoid shape.

34. The integrated assembly of claim 13 further comprising a conductive interconnect over and against the second semiconductor material, the conductive interconnect comprising a metal-containing material.

35. The integrated assembly of claim 34 wherein the conductive interconnect comprises a first conductive interconnect, and further comprising a second conductive interconnect over and against the first conductive interconnect.

36. The integrated assembly of claim 13 further comprising:
a conductive interconnect over the second semiconductor material; and
a bit line over and against the conductive interconnect.

37. The integrated assembly of claim 13 wherein the first semiconductor material extends below the stack of the alternating conductive levels and the insulative levels.

38. The integrated assembly of claim 23 wherein the channel-material-pillar comprises a horizontal width that equals a horizontal width of the second semiconductor material.

39. The integrated assembly of claim 23 wherein, in a vertical cross section, the channel-material-pillar comprises opposite sidewalls collinear with opposite sidewalls of the second semiconductor material.

40. The integrated assembly of claim 23 further comprising a conductive interconnect over and against the second semiconductor material, the conductive interconnect comprising a trapezoid shape.

41. The integrated assembly of claim 23 further comprising a conductive interconnect over and against the second semiconductor material, the conductive interconnect comprising a metal-containing material.

42. The integrated assembly of claim 41 wherein the conductive interconnect comprises a first conductive interconnect, and further comprising a second conductive interconnect over and against the first conductive interconnect.

43. The integrated assembly of claim 23 wherein the first semiconductor material comprises a dopant concentration of less than about $10^{15}$ atoms/cm$^3$.

44. The integrated assembly of claim 23 wherein the first semiconductor material comprises a dopant concentration of less than about $10^{16}$ atoms/cm$^3$.

45. The integrated assembly of claim 1 wherein the dopant of the first semiconductor material comprises n-type dopant.

46. The integrated assembly of claim 1 wherein the dopant of the first semiconductor material comprises n-type dopant and p-type dopant.

47. The integrated assembly of claim 1 wherein the dopant of the second semiconductor material comprises n-type dopant.

48. The integrated assembly of claim 1 wherein the dopant of the second semiconductor material comprises n-type dopant and p-type dopant.

49. The integrated assembly of claim 13 wherein the dopant of the first semiconductor material comprises n-type dopant.

50. The integrated assembly of claim 13 wherein the dopant of the first semiconductor material comprises n-type dopant and p-type dopant.

51. The integrated assembly of claim 13 wherein the dopant of the second semiconductor material comprises n-type dopant.

52. The integrated assembly of claim 13 wherein the dopant of the second semiconductor material comprises n-type dopant and p-type dopant.

53. The integrated assembly of claim 23 wherein the dopant of the first semiconductor material comprises n-type dopant.

54. The integrated assembly of claim 23 wherein the dopant of the first semiconductor material comprises n-type dopant and p-type dopant.

55. The integrated assembly of claim 23 wherein the dopant of the second semiconductor material comprises n-type dopant.

56. The integrated assembly of claim 23 wherein the dopant of the second semiconductor material comprises n-type dopant and p-type dopant.

* * * * *